(12) United States Patent
Sasaki

(10) Patent No.: US 11,105,523 B2
(45) Date of Patent: Aug. 31, 2021

(54) AIR CONDITIONER

(71) Applicant: SHINWA CONTROLS CO., LTD, Kawasaki (JP)

(72) Inventor: Isamu Sasaki, Kawasaki (JP)

(73) Assignee: Shinwa Controls Co., Ltd., Kawasaki (JP)

( * ) Notice: Subject to any disclaimer, the term of this patent is extended or adjusted under 35 U.S.C. 154(b) by 199 days.

(21) Appl. No.: 16/344,535

(22) PCT Filed: Nov. 7, 2017

(86) PCT No.: PCT/JP2017/040126
§ 371 (c)(1),
(2) Date: Apr. 24, 2019

(87) PCT Pub. No.: WO2018/088398
PCT Pub. Date: May 17, 2018

(65) Prior Publication Data
US 2020/0049357 A1 Feb. 13, 2020

(30) Foreign Application Priority Data

Nov. 10, 2016 (JP) .............................. JP2016-219837

(51) Int. Cl.
*F24F 6/02* (2006.01)
*F24F 6/08* (2006.01)
*G03F 7/20* (2006.01)

(52) U.S. Cl.
CPC ................ *F24F 6/025* (2013.01); *F24F 6/08* (2013.01); *G03F 7/70858* (2013.01)

(58) Field of Classification Search
CPC ...... F24F 6/02; F24F 6/025; F24F 6/04; F24F 6/08; F24F 2006/008; G03F 7/70858
(Continued)

(56) References Cited

U.S. PATENT DOCUMENTS 1,451,329 A * 4/1923 Dressler ............... F02M 35/024
261/22
2,013,270 A * 9/1935 Grady ....................... F24F 6/06
261/92
(Continued)

FOREIGN PATENT DOCUMENTS

CN 104110728 A 10/2014
JP H07-004685 A1 1/1995
(Continued)

OTHER PUBLICATIONS

International Search Report and Written Opinion (Application No. PCT/JP2017/040126) dated Jan. 23, 2018.
(Continued)

*Primary Examiner* — Charles D Bushey
(74) *Attorney, Agent, or Firm* — Burr & Brown, PLLC

(57) ABSTRACT

An air conditioner including; an air flow path through which air flows; a plate having an air through hole installed in a downstream opening of the air flow path; and a humidifier disposed on the air flow path and capable of supplying vapor into the air flow path. The air flow path has a horizontal channel provided with the downstream opening and extending along a horizontal direction, and the humidifier is disposed on the horizontal channel. The humidifier includes a water storage tank opened upward to an inside of the horizontal channel, and a heater that heats the water in the storage tank. The air conditioner further includes a moisture absorption member that extends in an up and down direction, above a wall part of the storage tank on the side of the plate, or diagonally thereabove on the side of the plate.

3 Claims, 6 Drawing Sheets

(58) Field of Classification Search
USPC ...... 261/30, 100, 105, 106, 107, 119.1, 127, 261/142, DIG. 15, DIG. 29, DIG. 34, 261/DIG. 41
See application file for complete search history.

(56) References Cited

U.S. PATENT DOCUMENTS

| | | | | |
|---|---|---|---|---|
| 2,078,833 | A * | 4/1937 | Bonner | F24F 6/06 261/92 |
| 2,384,016 | A * | 9/1945 | Dishner | F24F 5/0035 261/30 |
| 2,638,644 | A * | 5/1953 | Rauhut | F24F 6/043 96/142 |
| 3,311,355 | A * | 3/1967 | Rait | F24F 3/1417 261/2 |
| 3,799,517 | A * | 3/1974 | Tamm | B01F 3/04028 261/128 |
| 4,038,347 | A * | 7/1977 | Mickley | F24F 6/06 261/30 |
| 4,354,985 | A * | 10/1982 | Johnson | F24F 6/04 126/113 |
| 4,741,871 | A * | 5/1988 | Payha | F24F 6/025 126/113 |
| 5,015,451 | A * | 5/1991 | Holter | A62D 9/00 110/345 |
| 5,653,919 | A | 8/1997 | White et al. | |
| 5,699,983 | A | 12/1997 | Ellsworth | |
| 7,461,835 | B2 * | 12/2008 | Petz | F24F 3/12 261/119.1 |
| 2003/0067086 | A1 * | 4/2003 | Mulvaney | F24F 6/00 261/107 |

FOREIGN PATENT DOCUMENTS

| | | |
|---|---|---|
| JP | H10-220796 A1 | 8/1998 |
| JP | 2001-254976 A1 | 9/2001 |
| JP | 2001-317770 A1 | 11/2001 |
| JP | 2004-053238 A1 | 2/2004 |
| JP | 2007-335544 A1 | 12/2007 |
| JP | 2010-236742 A1 | 10/2010 |
| JP | 2015-058060 A1 | 3/2015 |
| JP | 2016-106663 A1 | 6/2016 |
| KR | 20-1997-006598 U | 2/1997 |

OTHER PUBLICATIONS

Chinese Office Action (Application No. 201780068755.7) dated Jun. 19, 2020 (with English translation).
English translation of International Preliminary Report on Patentability (Chapter I) (Application No. PCT/JP2017/040126) dated May 23, 2019, 11 pages.

* cited by examiner

AIR CONDITIONER

BACKGROUND OF THE INVENTION

Field of the Invention

The present invention relates to an air conditioner.

Description of Related Art

In a pattern forming step in the manufacture of a semiconductor, a photolithography is sometimes utilized. In the photolithography, a photosensitive resist is applied to a substrate, and then the resist is exposed to light corresponding to a desired pattern. When the resist is a photo-curing type photosensitive material, for example, an area of the resist, which is not exposed to light, is removed by a solvent. Thus, the desired pattern can be formed (developed) on the resist.

It is known that a film thickness of such a resist applied or exposure may change, depending on a temperature and a humidity. Thus, when a temperature and a humidity of air in an environment surrounding the resist largely differ from a desired temperature and a humidity, dimensional precision of a formed pattern may be significantly lowered. Thus, in general, a temperature and a humidity of an apparatus for performing the photolithography and its surrounding environment are precisely controlled by an air conditioner.

In the field of air conditioners for precisely controlling a temperature and a humidity as described above, various techniques have been proposed heretofore. For example, Patent Document 1 discloses an apparatus in which a mesh-like member is accommodated in a pan, in order to prevent shaking of water stored in the pan. In this apparatus, the precision of the humidity control is improved by preventing shaking of water stored in the pan.

Patent Document 1: JP2007-335544A

As an example of an air conditioner for precisely controlling a temperature and a humidity, an air conditioner is known, which comprises an air flow path through which air flows, a cooler, a heater and a humidifier, which are accommodated in the air flow path, wherein a temperature and a humidity of air are controlled in the air flow path. Such an air conditioner sometimes employs a structure in which a metal plate with an air through hole is installed in a downstream opening of the air flow path, so that air in the air flow path is made to flow downward through the air through hole.

However, the present inventor has found that a humidity spike is likely to occur in the air conditioner employing the aforementioned structure. The humidity spike means a phenomenon in which an air humidity instantaneously deviates seriously from a target value. The present inventor has conducted extensive studies and found that the humidity spike is mainly caused by the fact that vapor from the humidifier condenses on a wall surface around the through hole of the aforementioned plate, and the water generated on the wall surface combines with air and flows downstream.

The present invention has been made in view of the above finding. The object of the present invention is to provide an air conditioner capable of preventing water generated by dew condensation of vapor from being combined with air so as to stably control an air humidity.

SUMMARY OF THE INVENTION

The present invention is:
an air conditioner comprising:
an air flow path through which air flows;
a plate installed in a downstream opening of the air flow path, the plate being provided with an air through hole; and
a humidifier disposed on the air flow path and capable of supplying vapor into the air flow path;
wherein:
the air flow path has a horizontal channel provided with the downstream opening and extending along a horizontal direction;
the humidifier is disposed on the horizontal channel;
the humidifier includes a storage tank that stores water, the storage tank being opened upward to an inside of the horizontal channel, and a heater that heats the water in the storage tank; and
the air conditioner further comprises a moisture absorption member that extends in an up and down direction, above a wall part of the storage tank on the side of the plate, or diagonally thereabove on the side of the plate.

The air conditioner according to the present invention enables that a part of vapor from the storage tank can be held in a water condition by the moisture absorption member, so that it can be prevented that the vapor condenses around the air through hole of the plate. In particular, vapor coming from the storage tank on the side of the plate is likely to be combined with air so as to adhere to the periphery of the air thought hole to form dew drops. However, since the moisture absorption member is positioned on the side of the plate of the storage tank, dew condensation of vapor can be efficiently prevented. Thus, water generated by dew condensation of vapor can be prevented from being combined with air, whereby an air humidity can be stably controlled.

In the air conditioner according to the present invention, when seen along an extension direction of the horizontal channel, the moisture absorption member may cover a part of the air through hole.

In this case, by covering a part of the air through hole with the moisture absorption member, it can be prevented that condensed water passes a part of the air through hole. Thus, water generated by dew condensation of vapor can be prevented from being combined with air on the downstream side of the air through hole, whereby air humidity control precision can be improved.

In addition, in the air conditioner according to the present invention, the moisture absorption member may cover a part of the air through hole, the part ranging from a lower end of the air through hole up to ⅓ of the maximum length thereof in the up and down direction.

In this case, due to the fact that the moisture absorption member covers a part of the air through hole, the part ranging from a lower end of the air through hole up to ⅓ of the maximum length thereof in the up and down direction, it can be effectively prevented that condensed water passes through the air though hole, while preventing that pressure loss caused by the moisture absorption member excessively increases.

In addition, in the air conditioner according to the present invention, the moisture absorption member may be a sponge.

In this case, the moisture absorption member can be manufactured inexpensively, while preventing that pressure loss caused by the moisture absorption member excessively increases.

In addition, the air conditioner according to the present invention may further comprise a support member that extends along a surface of the moisture absorption member on the side of the plate, so as to support the surface of the moisture absorption member on the side of the plate.

In this case, since the moisture absorption member is supported by the support member, fluttering of the moisture absorption member, which may be caused by flow of air, can be prevented, although the moisture absorption member is soft and flexible. Thus, suitable moisture absorption effect can be ensured.

According to the present invention, water generated by dew condensation of vapor can be prevented from being combined with air, so that an air humidity can be stably controlled.

DETAILED DESCRIPTION OF THE INVENTION

An embodiment of the present invention is described in detail below, with reference to the attached drawings.

(Overall Structure of Air Conditioner)

Figure 1:
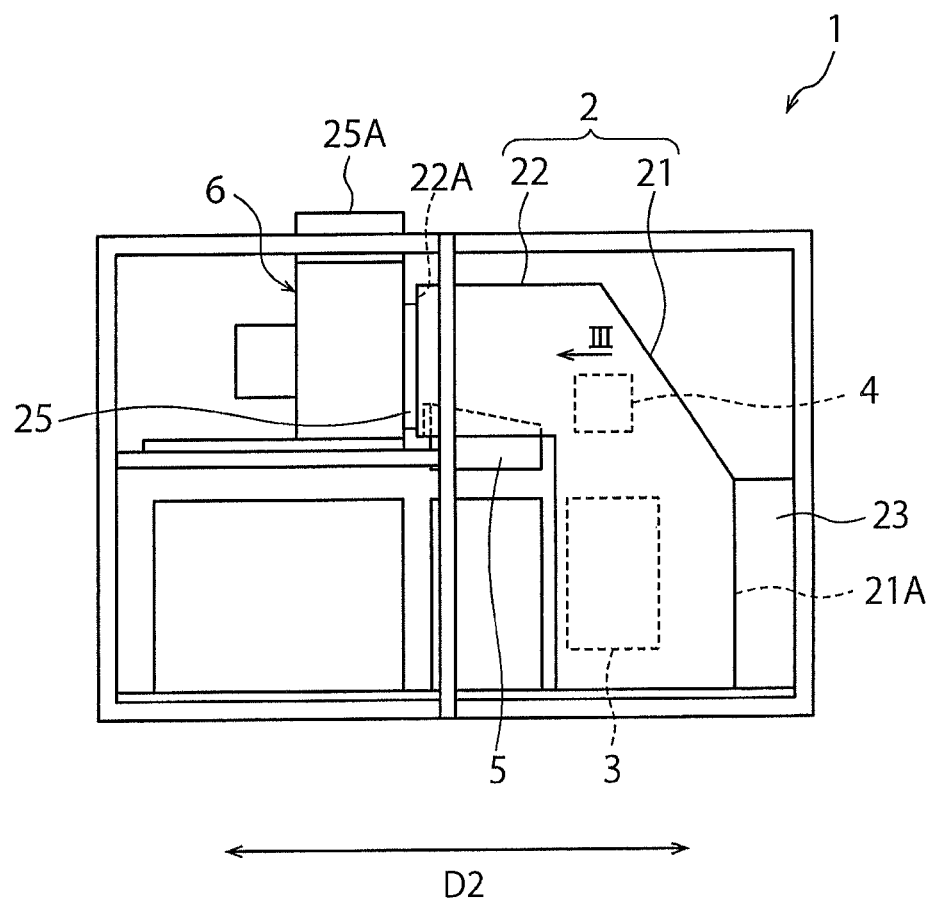
FIG. 1 is a side view of an air conditioner according to one embodiment of the present invention.

FIG. 1 is a side view of an air conditioner 1 according to an embodiment of the present invention. As shown in FIG. 1, the air conditioner 1 according to the embodiment comprises an air flow path 2 through which air flows, a cooler 3, a heating unit 4 and a humidifier 5, which are disposed in the air flow path 2, and a blower 6 that creates a driving force for allowing air to flow through the air flow path 2. The air flow path 2 has a vertical channel 21 that extends vertically, and a horizontal channel 22 that communicates with an upper part of the vertical channel 21 and extends horizontally from the upper part. In the below description, a direction orthogonal to a sheet plane of FIG. 1 along the horizontal direction is referred to as "first direction D1", and a direction orthogonal to the first direction D1 along the horizontal direction is referred to as "second direction D2" which is shown by an arrow in FIG. 1. The horizontal channel 22 extends along the second direction D2.

The vertical channel 21 is provided with, in a lower part thereof, an upstream opening 21A that is opened along the horizontal direction. In this embodiment, the upstream opening 21A is opened from the inside of the vertical channel 21 toward one side (right side in FIG. 1) of the second direction D2. The upstream opening 21A is provided for taking air to the inside of the vertical channel 21. In this embodiment, a filter device 23 disposed outside the upstream opening 21A covers the upstream opening 21A. Thus, air from which particles have been removed by the filter device 23 is taken from the upstream opening 21A to the inside of the vertical channel 21. In the below description, a direction referred to as one side of the second direction D2 means the right direction in FIG. 1, and a direction referred to as the other side of the second direction D2 means the left direction in FIG. 1.

Figure 2:
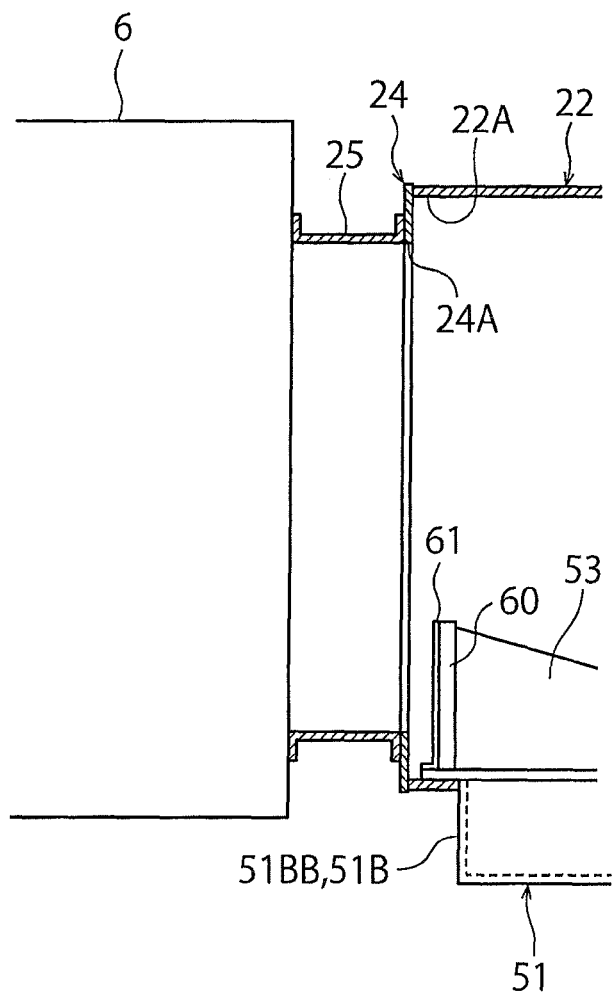
FIG. 2 is a sectional view of a part around a downstream opening of an air flow path of the air conditioner of FIG. 1.

The horizontal channel 22 is provided with a downstream opening 22A at an end opposite to the vertical channel 21, i.e., at an end on the other side of the second direction D2. FIG. 2 shows a longitudinal sectional view of a part around the downstream opening 22A of the horizontal channel 22 in the air flow path 2, in a plane along the second direction D2. As shown in FIG. 2, in this embodiment, a plate 24 with an air through hole 24A is installed in or attached to the downstream opening 22A. The plate 24 is installed to cover the downstream opening 22A with an area thereof in which the air through hole 24A is not formed. The air through hole 24A is formed to be smaller than the downstream opening 22A. Thus, in this embodiment, the air, which has been taken from the upstream opening 21A to the inside of the air flow path 2, is sent to the outside of the air flow path 2 from the air through hole 24A of the plate 24.

The plate 24 is formed of a plate member made of, e.g., stainless. In this embodiment, the plate 24 is fixed to the horizontal channel 22 by a screw. However, the plate 24 may be integrated with the horizontal channel 22 by welding, or the plate 24 and the horizontal channel 22 may be formed as a single piece made of one material. In addition, although the air through hole 24A is a circular hole (see FIG. 3), the air though hole 24A may have another shape such as a rectangular shape.

As shown in FIGS. 1 and 2, the blower 6 is located oppositely to the plate 24 in the second direction D2, and communicates with the air through hole 24A through a duct 25. When the blower 6 rotates a fan, not shown, the air inside the air flow channel 2 is taken into an inside thereof, and is then discharged from an outlet port 25A opened upward. Since the blower 6 takes thereinto the air inside the air flow path 2, outside air is taken from the upstream opening 21A to the inside of the air flow path 2. Thus, air flows through the air flow path 2.

As shown in FIG. 1, in this embodiment, a cooler 3 is disposed in a lower part of the vertical channel 21, and a heating unit 4 is disposed in an upper part of the vertical channel 21. The cooler 3 may be an evaporator in a cooling circuit in which a compressor, a condenser, an expansion valve and the evaporator are connected by pipes in this order so as to circulate a heat medium. In addition, the heating unit 4 may be an electric heater, or a heater that utilizes a part of the heat medium having a high temperature in the aforementioned cooing circuit. The cooler 3 can cool air inside the air flow path 2 by means of its variable refrigeration capacity, and the heating unit 4 can heat air inside the air flow path 2 by means of its variable heating capacity. The humidifier 5 is disposed in the horizontal channel 22, and can supply vapor into the air flow path 2.

(Humidifier)

Figure 3:
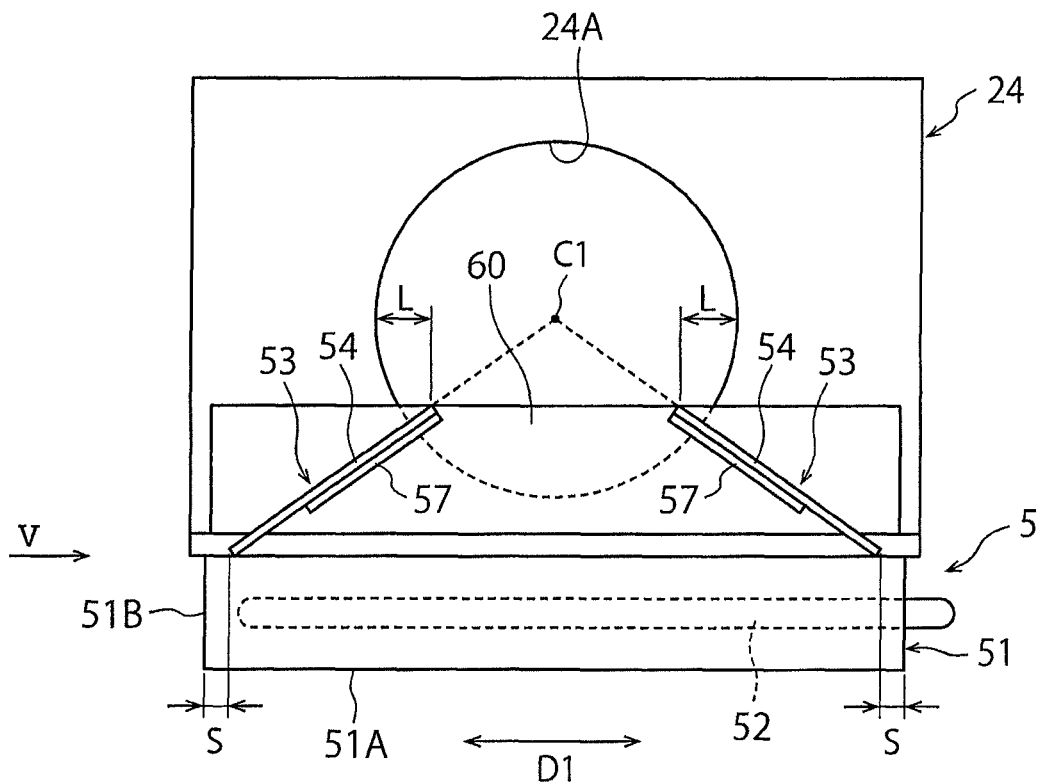
FIG. 3 is a view of a part around a humidifier disposed in the air flow path of the air conditioner of FIG. 1, when seen along a direction of an arrow III of FIG. 1 parallel with the horizontal direction.
Figure 4:
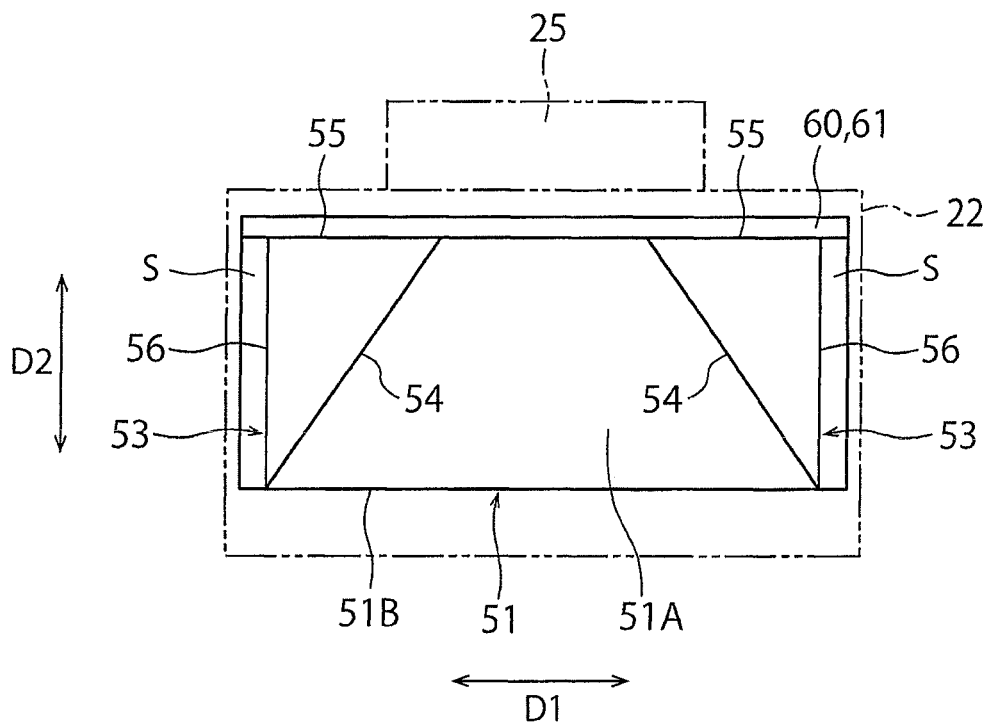
FIG. 4 is a top view of the humidifier shown in FIG. 3.
Figure 5:
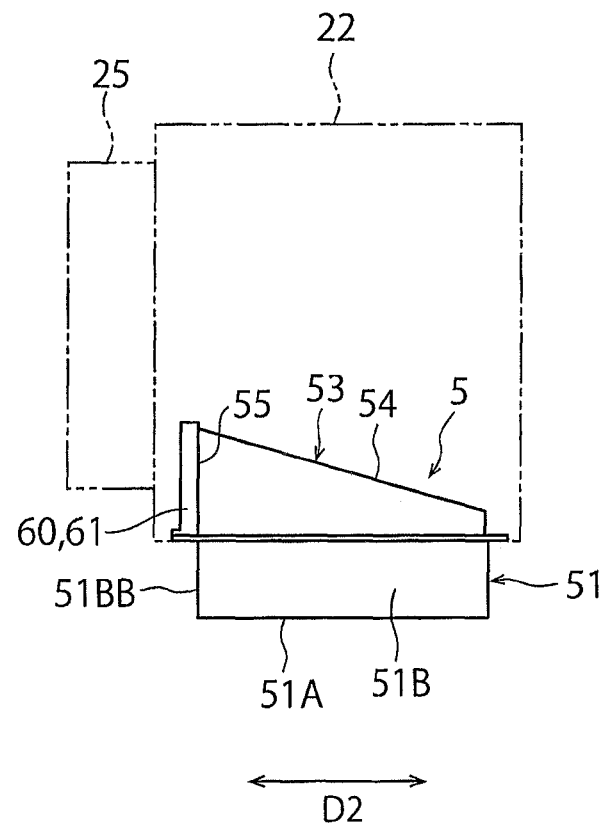
FIG. 5 is a view of the humidifier shown in FIG. 3, when seen along an arrow V of FIG. 3.
Figure 6:
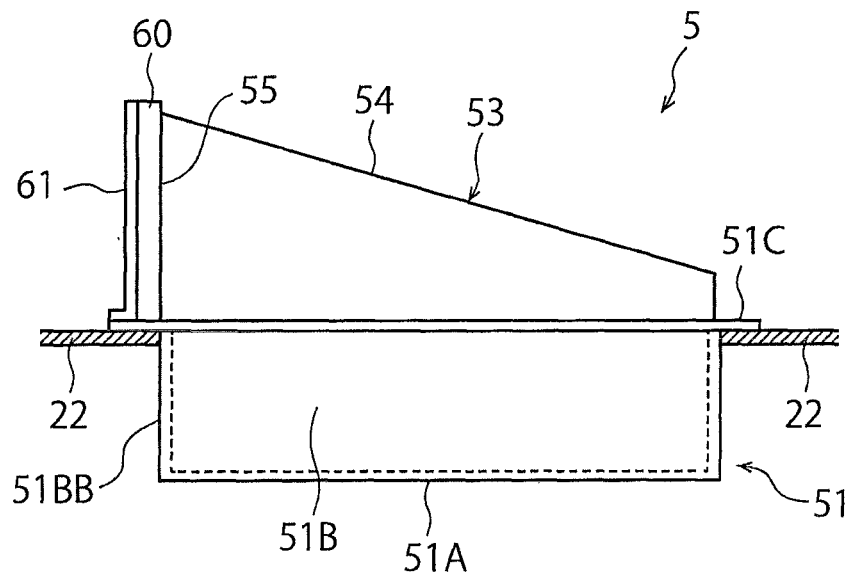
FIG. 6 is an enlarged view of a main part of FIG. 5.

Next, the humidifier 5 is described with reference to FIGS. 3 to 6. FIG. 3 is a view of a part around the humidifier 5 disposed in the air flow path 2, when seen along a direction of an arrow III of FIG. 1 parallel with the horizontal direction. In more detail, FIG. 3 is a view of the part around the humidifier 5, when seen from the inside of the air flow path 2 toward the other side of the second direction D2. FIG. 4 is a top view of the humidifier 5. In FIG. 4, the aforementioned horizontal channel 22 and the duct 25 are shown by the two-dot chain lines, for the purpose of illustration. FIG. 5 is a view of the humidifier 5, when seen along an arrow V of FIG. 3. In FIG. 5, the aforementioned horizontal channel 22 and the duct 25 are shown by the two-dot chain lines, for the purpose of illustration. FIG. 6 is an enlarged view of a main part of FIG. 5.

As shown in FIGS. 3 to 6, the humidifier 5 in this embodiment has a storage tank 51 that stores water, which is opened upward to the inside of the horizontal channel 22, a heater 52 that heats the water in the storage tank 51, and a pair of guide plates 53. The pair of guide plates 53 are located above the storage tank 51 respectively on one side and the other side of the first direction D1 extending along the horizontal direction, with respect to the center of the storage tank 51. Each guide plate 53 is inclined to extend such that an upper part thereof is positioned nearer to a center side of the storage tank 51 in the first direction D1 than a lower part thereof. In the humidifier 5 according to this embodiment, since the pair of guide plates 53 are located oppositely in the first direction D1, a direction, which is orthogonal to, in a horizontal plane, the direction in which the pair of guide plates 53 are opposed to each other, corresponds to the second direction D2. Thus, a direction, which is orthogonal to the direction in which the pair of guide plates 53 are opposed to each other, is parallel to a direction along which the horizontal channel 22 extends.

In the below description, a direction referred to as one side of the first direction D1 means the left direction in FIG. 3, and a direction referred to as the other side of the first direction D1 means the right direction of FIG. 3. In addition, a direction referred to as one side of the second direction D2 means the down direction in FIG. 4, and a direction referred to as the other side of the second direction D2 means the up direction in FIG. 4.

The storage tank 51 has a bottom wall 51A and a peripheral wall 51B that stands up from the whole area of an outer periphery of the bottom wall 51A. The bottom wall 51A and the peripheral wall 51B are formed of plate members made of, e.g., stainless. In the top view, the storage tank 51 has a rectangular shape having a longitudinal direction in the first direction D1. The peripheral wall 51B has a pair of wall parts that are positioned on the one side and the other side of the first direction D1, which correspond to a pair of short sides of the rectangular shape, and a pair of wall parts that are positioned on the one side and the other side of the second direction D2, which correspond to a pair of long sides of the rectangular shape. As to a positional relationship between the storage tank 51 and the air through hole 24A of the plate 24, as shown in FIG. 3, the air through hole 24A is positioned above the storage tank 51, when seen along the second direction D2.

In this embodiment, the storage tank 51 is disposed to pass through a lower wall of the horizontal channel 22. To be more specific, as shown in FIG. 6, the peripheral wall 51B is provided with a flange 51C extending outward. The storage tank 51 held on the lower wall of the horizontal channel 22 in such a manner that the flange 51C is locked on an outer periphery of an opening formed in the lower wall of the horizontal channel 22. In this embodiment, a part of the storage tank 51 is exposed outside the horizontal channel 22, but the humidifier 5 is accommodated as a whole inside the horizontal channel 22. As shown in FIG. 3, the heater 52 is accommodated inside the storage tank 51, and extends along the longitudinal direction of the storage tank 51. The humidifier 5 controls a heat value of the heater 52 to control an amount of vapor generated from the water stored in the storage tank 51, whereby a humidity of air flowing through the air flow path 2 can be controlled to a desired humidity.

The pair of guide plates 53 are formed of plate members made of, e.g., stainless, and are supported by support members, not shown, which stand up from the bottom wall 51A of the storage tank 51, so as to be maintained in a posture that is inclined with respect to the horizontal direction. In this embodiment, the pair of guide plates 53 are symmetrical with reference to a vertical plane which passes the center of the storage tank 51 in the first direction D1 and extends along the second direction D2. The upper parts of the pair of guide plates 53 are spaced apart from each other in the first direction in the first direction D1, so that vapor from the storage tank 51 can pass through the space between the upper parts of the pair of guide plates 53. In this embodiment, when seen along the second direction D2, the pair of guide plates 53 linearly extend, but they may curvilinearly extend.

As shown in FIG. 4, each of the pair of guide plates 53 have an inclined side part 54 which is positioned such that, in the top view, an end thereof on the one side of the second direction D2 is more distant from the center of the storage tank 51 in the first direction D1 than an end thereof on the other side of the second direction, the other side part 55 facing the other side of the second direction D2, and a lower side part 56 that is positioned on the side of the storage tank 51 in the up and down direction and extends along the second direction D2. In the illustrated example, the inclined side part 54, the other side part 55 and the lower side part 56 are connected to define a triangular shape in the top view.

Since the aforementioned plate 24 and the blower 6 are positioned on the other side of the second direction D2 with respect to the humidifier 5, the other side part 55 faces the side of the plate 24 and the blower 6. On the other hand, the inclined side part 54 is connected to an end of the other side part 55 on the center side of the storage tank 51 in the first direction D1, so as to face oppositely to the side of the plate 24 and the blower 6. As shown in FIG. 5, when seen along the first direction D1, the inclined side part 54 is inclined to extend diagonally upward toward the plate 24 and the blower 6.

As shown in FIG. 4, the other side part 55 in this embodiment extends along the first direction D1, so that the other side part 55 is parallel to a wall part 51BB of the storage tank 51 on the other side of the second direction D2. As shown in FIGS. 4 to 6, in the top view, the other side part 55 overlaps with the wall part 51BB of the storage tank 51 on the other side of the second direction D2. In this embodiment, in the top view, the other side part 55 overlaps with the wall part 51BB of the storage tank 51 on the other side of the second direction D2. However, in the top view, the other side part 55 may be positioned outside the wall part 51BB.

As shown in FIG. 3, the other side part 55 is provided with a projection 57 that projects downward and extends along the other side part 55. In this embodiment, the projection 57 and the guide plate 53 are formed as a single piece made of one material. However, the projection 57 may be fixed to the guide plate 53 by a screw, or may de fixed to the guide plate 53 by welding or the like.

On the other hand, as shown in FIGS. 3 and 4, each of the lower side parts 56 is apart from the wall part of the storage tank 51 on the side on which this guide plate 53 is positioned. Namely, in this embodiment, the guide plate 53 is disposed such that, in the top view, a gap S is formed between the guide plate 53 and the wall part of the storage tank 51 on the side on which this guide plate 53 is positioned in the first direction D1. In this embodiment, a float switch, not shown, is arranged to pass through the gap S between the guide plate 53, which is positioned on the other side of the first direction D1, and the wall part of the storage tank 51. Such a gap S may not be formed.

In addition, in this embodiment, as shown in FIG. 3, when seen along the second direction D2, a part of the guide plate 53 overlaps with the air through hole 24A of the plate 24. In addition, when seen along the second direction D2, a line extended diagonally upward from the upper part of the guide plate 53 passes through a center C1 of the air through hole 24A. It is preferable that the aforementioned extension line of the guide plate 53 passes through the center C1 of the air through hole 24A, and that the extension line defines an angle of 20° to 30° with respect to a straight line along the first direction D1. From the extensive studies, the present inventor has found that humidity control precision can be improved by setting an angle of the guide plate 53 within such an angular range. In this embodiment, when seen along the second direction D2, the guide plate 53 overlaps with the air through hole 24A of the plate 24. However, the guide plate 53 may not overlap with the air through hole 24A, and the upper part of the guide plate 53 may be positioned below the air through hole 24A.

In addition, as shown in FIG. 3, a distance L, in which the guide plate 53 projects from an end point of the air through hole 24A in the first direction D1 toward the center side of the air through hole 24A, is preferably $5/36$ to $10/36$ with respect to the diameter of the air through hole 24A. Particularly in this embodiment, the above distance is $6/36$ ($1/6$). From the extensive studies, the present inventor has found that humidity control precision can be improved by setting the position of the guide plate 53 within such a dimensional range.

On the other hand, the humidifier 5 further comprises a moisture absorption member 60 extending in the up and down direction, at a position above the wall part 51BB of the storage tank 51 on the other side (plate 24 side) in the second direction D2, or diagonally thereabove the other side of the second direction D2. As shown in FIG. 3, the moisture absorption member 60 is of a rectangular shape having a longitudinal direction in the first direction D1, and extends outward across the pair of guide plates 53 in the first direction D1. In addition, as shown in FIGS. 4 and 5, the moisture absorption member 60 is formed to have a plate-like shape.

When seen along the second direction D2, i.e., the extension direction of the horizontal channel 22, the moisture absorption member 60 covers a part of the air through hole 24A. In the illustrated example, the moisture absorption member 60 covers a part of the air through hole 24A, the part ranging from a lower end of the air through hole 24A up to $1/3$ of the maximum length thereof in the up and down direction. In this embodiment, the moisture absorption member 60 covers a part of the air thought hole 24A. In more detail, the moisture absorption member 60 strides across a part of the air through hole 24A and the wall surface of the plate 24 so as to cover the part of the air through hole 24A and the wall surface of the plate 24. However, the moisture absorption member 60 may not cover the air through hole 24A. For example, the moisture absorption member 60 may cover only the wall surface of the plate 24, which is below the lower end of the air through hole 24A. In addition, the moisture absorption member 60 may cover a diagonally downward part of the air through hole 24A and the lateral wall surface of the plate 24.

In this embodiment, the moisture absorption member 60 is a sponge, and is supported by a plate-like support member 61 made of, e.g., stainless, which is shown in FIG. 6. In the illustrated example, the support member 61 extends along a surface of the moisture absorption member 60 on the side of the plate 24, so as to support the surface. The support member 61 is fixed on the flange 51C extending from the wall part 51BB of the storage tank 51 toward the plate 24, and extends upward. The sponge forming the moisture absorption member 60 is made of a synthetic resin which is preferably a polyurethane foam. In particular, the sponge forming the moisture absorption member 60 is preferably a soft polyurethane foam among polyurethane foams, and more preferably a polyether-based soft polyurethane foam. Since the moisture absorption member 60 made of a polyether-based soft polyurethane foam does not affect a semiconductor manufacturing step, such a moisture absorption member 60 is useful particularly in the manufacture of semiconductors. However, as long as the moisture absorption member 60 has moisture absorbency, the moisture absorption member 60 may be made of a material different from a sponge. For example, the moisture absorption member 60 may be made of a fibrous material such as cloth or a porous material.

Next, an operation of the embodiment is described.

In the air conditioner 1 according to this embodiment, the blower 6 rotates the fan so that air inside the air flow path 2 is taken to the inside of the blower 6, and the air is discharged from the outlet port 25A opened upward. Since the blower 6 takes thereinto the air inside the air flow path 2, outside air is taken from the upstream opening 21A of the air flow path 2 to the inside of the air flow path 2. Thus, the air flows through the air flow path 2. The air taken into the air flow path 2 is firstly cooled by the cooler 3, and is then heated by the heating unit 4 so as to be controlled to have a desired temperature. Thereafter, the air passes through above the humidifier 5, so that its humidity is controlled.

Figure 7:
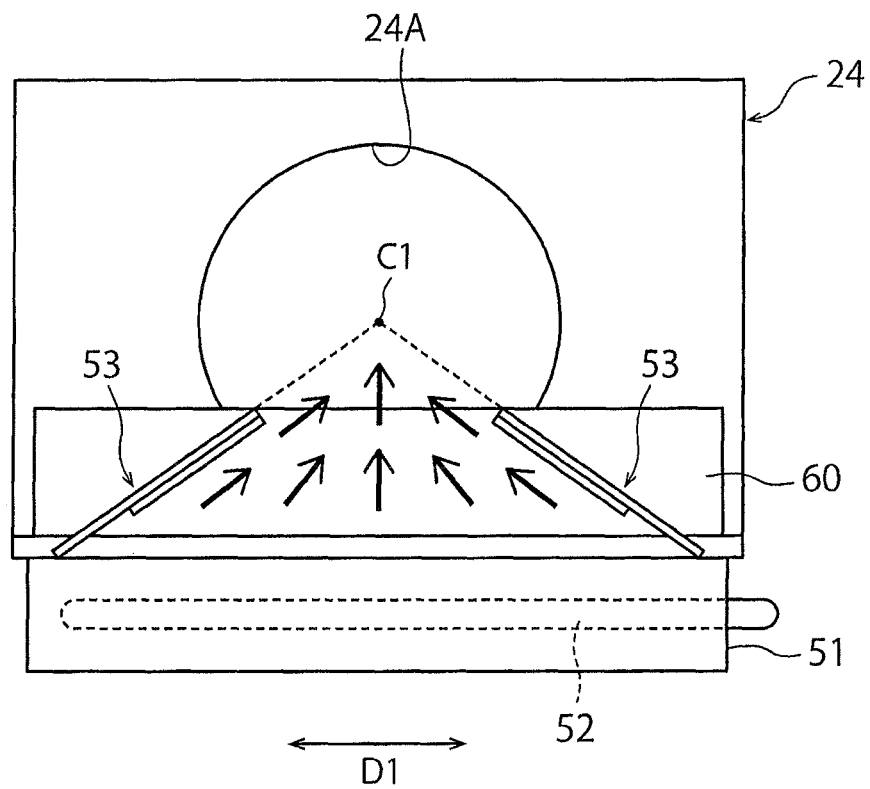
FIG. 7 is a view for describing an air flow above the humidifier in the air condition shown in FIG. 1.
Figure 8:
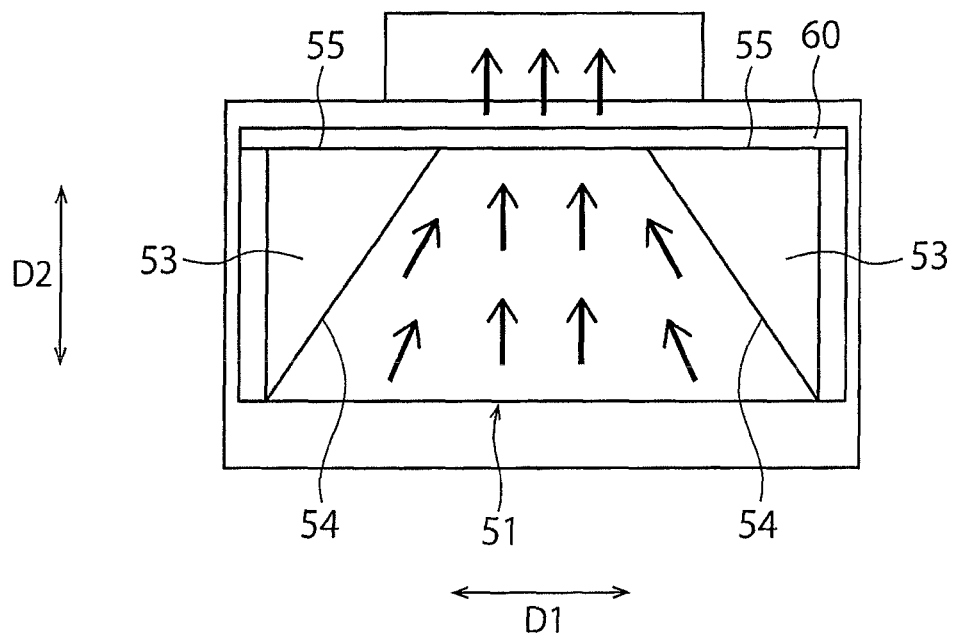
FIG. 8 is a view for describing an air flow above the humidifier in the air condition shown in FIG. 1.
Figure 9:
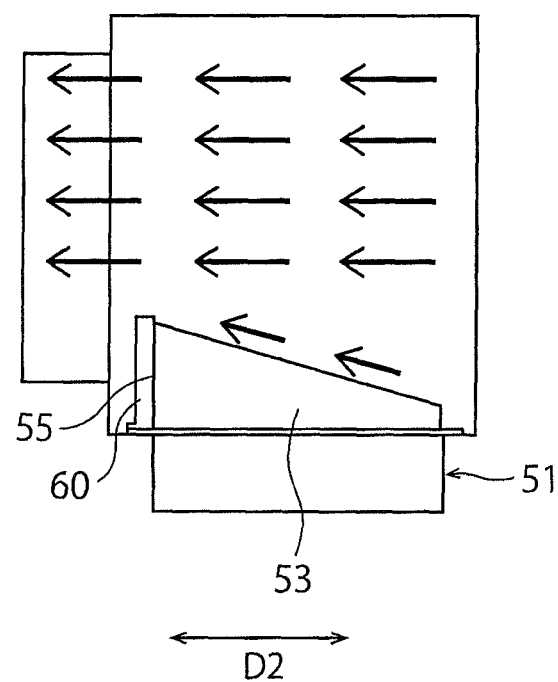
FIG. 9 is a view for describing an air flow above the humidifier in the air condition shown in FIG. 1.

FIGS. 7 to 9 show a flow of air passing through the humidifier 5 by arrows. The humidifier 5 allows air, which comes from a direction intersecting the first direction D1 on a horizontal plane in the horizontal channel 22 of the air flow path 2 to pass through above the storage tank 51, to be combined with vapor from the storage tank 51. As shown by the arrows in the respective drawings, the humidifier 5 enables the air combined with vapor to go outside the storage tank 51, while the air is guided by the guide plates 53 toward the center side of the storage tank 51.

Thus, under a state in which the humidifier 5 is set such that the air through hole 24A of the plate 24 is positioned on the extension lines of the guide plates 53 when seen along a direction orthogonal to the first direction D1 on a horizontal plane, i.e., along the second direction D2, the air combined with vapor can be gathered in the air through hole 24A of the plate 24. On the other hand, it can be prevented that the air combined with vapor diffuses broadly and condenses on an undesired area, specifically, an area around the air through hole 24A of the plate 24.

In addition, a part of the vapor from the storage tank 51 can be held in a water condition by the moisture absorption member 60, whereby it can be prevented that the vapor condenses around the air through hole 24A of the plate 24. In particular, vapor coming from the storage tank 51 on the side of the plate 24 is likely to be combined with air so as to adhere to the periphery of the air thought hole 24A to form dew drops. However, since the moisture absorption member 60 is positioned on the side of the plate 24 of the storage tank 51, dew condensation of vapor can be efficiently prevented.

Therefore, according to the aforementioned embodiment, water generated by dew condensation of vapor can be prevented from being combined with air, so that an air humidity can be stably controlled.

In addition, in this embodiment, when seen along the extension direction of the horizontal channel 22, the moisture absorption member 60 covers a part of the air through hole 24A. Due to this structure, it can be prevented that condensed water passes a part of the air through hole 24A. Thus, water generated by dew condensation of vapor can be prevented from being combined with air on the downstream side of the air through hole 24A, whereby air humidity control precision can be improved.

In particular, the moisture absorption member 60 covers a part of the air through hole 24A, the part ranging from a lower end of the air through hole 24A up to ⅓ of the maximum length thereof in the up and down direction. Due to this structure, it can be effectively prevented that condensed water passes through the air though hole 24A, while preventing that pressure loss caused by the moisture absorption member 60 excessively increases.

In addition, the moisture absorption member 60 is a sponge. Due to this structure, the moisture absorption member 60 can be manufactured inexpensively, while preventing that pressure loss caused by the moisture absorption member 60 excessively increases.

In addition, the surface of the moisture absorption member 60 on the side of the plate 24 is supported by the support member 61 extending along the surface of the moisture absorption member 60 on the side of the plate 24. Due to this structure, although the moisture absorption member 60 is soft and flexible, fluttering of the moisture absorption member 60, which may be caused by flow of air, can be prevented.

The one embodiment of the present invention has been described above, but the present invention is not limited to the aforementioned embodiment. For example, in the above embodiment, the guide plate 53 is disposed on both side with respect to the center of the storage tank 51 in the first direction D1. However, the guide plate 53 may be provided on only one side with respect to the center of the storage tank 51.

The invention claimed is:

1. An air conditioner comprising:
   an air flow path through which air flows;
   a plate installed in a downstream opening of the air flow path, the plate being provided with an air through hole; and
   a humidifier disposed on the air flow path and capable of supplying vapor into the air flow path;
   wherein the air flow path has a horizontal channel provided with the downstream opening and extending along a horizontal direction;
   wherein the humidifier is disposed on the horizontal channel;
   wherein the humidifier includes a storage tank that stores water, the storage tank being opened upward to an inside of the horizontal channel, and a heater that heats the water in the storage tank;
   wherein the air conditioner further comprises a moisture absorption member that extends in an up and down direction, above a wall part of the storage tank on the side of the plate, or diagonally thereabove on the side of the plate; and
   wherein, when viewed along an extension direction of the horizontal channel, the moisture absorption member covers a part of the air through hole and the wall surface of the plate, the part of the air through hole ranging from a lower end of the air through hole up to ⅓ of the maximum length thereof in the up and down direction.

2. The air conditioner according to claim 1, wherein the moisture absorption member is a sponge.

3. The air conditioner according to claim 2, further comprising a support member that extends along a surface of the moisture absorption member on the side of the plate, so as to support the surface of the moisture absorption member on the side of the plate.

* * * * *